United States Patent [19]

Doverspike et al.

[11] Patent Number: 5,665,430

[45] Date of Patent: Sep. 9, 1997

[54] CHEMICAL VAPOR DEPOSITION METHOD FOR DEPOSITING DIAMOND USING A HIGH TEMPERATURE VACUUM SUBSTRATE MOUNT

[75] Inventors: Kathleen Doverspike, Alexandria; James E. Butler, Arlington, both of Va.

[73] Assignee: The United States of America as represented by the Secretary of the Navy, Washington, D.C.

[21] Appl. No.: 953,908

[22] Filed: Sep. 30, 1992

[51] Int. Cl.$^6$ ................................................ C23C 16/26
[52] U.S. Cl. ................................... 427/249; 118/728
[58] Field of Search ..................... 427/249, 248.1; 118/728; 428/408; 430/448

[56] References Cited

U.S. PATENT DOCUMENTS

| | | | |
|---|---|---|---|
| 4,029,351 | 6/1977 | Apgar et al. | 294/64 B |
| 4,521,268 | 6/1985 | Bok | 118/728 |
| 4,566,726 | 1/1986 | Correnti et al. | 294/64.3 |
| 4,620,738 | 11/1986 | Schwartz et al. | 294/64.1 |
| 4,919,974 | 4/1990 | McCune et al. | 427/249 |
| 4,938,940 | 7/1990 | Hirose et al. | 427/249 |
| 4,963,393 | 10/1990 | Goela et al. | 427/249 |
| 4,988,421 | 1/1991 | Drawl et al. | 427/249 |
| 5,068,871 | 11/1991 | Uchida et al. | 427/249 |
| 5,080,975 | 1/1992 | Komaki et al. | 427/249 |
| 5,096,736 | 3/1992 | Anthony et al. | 427/249 |
| 5,108,779 | 4/1992 | Gasworth | 427/249 |
| 5,110,577 | 5/1992 | Tamor et a. | 427/249 |
| 5,112,643 | 5/1992 | Ikegaya et al. | 427/249 |

FOREIGN PATENT DOCUMENTS

| | | |
|---|---|---|
| 02-192491 | 7/1990 | Japan . |
| 03-112895 | 5/1991 | Japan . |

OTHER PUBLICATIONS

Snail, K. A, et al. "High Temperature, High Rate Homoepitaxial Growth of Diamond in an Atmospheric Pressure Flame" Journal of Crystal Growth 112 (Jul. 1991) pp. 651–659.

*Primary Examiner*—Shrive Beck
*Assistant Examiner*—Bret B. Chen
*Attorney, Agent, or Firm*—Thomas E. McDonnell; Ralph T. Webb

[57] ABSTRACT

A method for the chemical vapor deposition of diamond includes the steps of:

(a) applying a thermally conductive paint between a substrate seed crystal and an end surface of a vacuum line [having an inner surface and an outer surface], the vacuum line protruding through a mount;

(b) holding within a chemical vapor deposition flame the substrate seed crystal upon the mount by applying a vacuum to the substrate seed crystal via the vacuum line protruding through the mount, wherein a portion of an outer surface of the vacuum line in contact with the mount is coated with a thermally conductive lubricant;

(c) flowing a heat exchanging fluid through the mount to maintain the surface of the substrate seed crystal at a temperature suitable for chemical vapor deposition of diamond; and (d) directing a deposition species for chemical vapor deposition to deposit diamond onto a surface of the substrate seed crystal.

5 Claims, 4 Drawing Sheets

CHEMICAL VAPOR DEPOSITION METHOD FOR DEPOSITING DIAMOND USING A HIGH TEMPERATURE VACUUM SUBSTRATE MOUNT

BACKGROUND OF THE INVENTION

1. Field of the Invention

The present invention relates generally to the growth of diamond on a substrate seed crystal by chemical vapor deposition and more specifically to an apparatus and method for mounting a substrate seed crystal for the chemical vapor deposition of diamond.

2. Description of the Related Art

Most chemical vapor deposition processes for diamond growth occur at high temperatures of at least as high as 600°–1600° C. In the field of diamond growth by chemical vapor deposition, a diamond or a doped diamond substrate seed crystal is held within an oxygen-acetylene flame in order to promote the deposition of diamond on the substrate seed crystal in a hydrogen and hydrocarbon rich atmosphere. The temperature of the substrate seed crystal is regulated between 600°–1600° C.

To hold the substrate seed crystal within the flame, a brazing material is used to attach a substrate seed crystal to a mount. The mount is a rod to which the substrate seed crystal is attached by the use of a brazing material, which brazing material acts much like a glue between the rod and the substrate seed crystal.

There are two common problems with the use of a brazing material. The first problem is that the braze usually melts in the 900°–1200° C. range. The second problem is that the braze increases the possibility of contaminating the substrate seed crystal.

In addition, there is a common problem associated with the use of a conventional mount, a rod brazed to the substrate seed crystal. Typically, the substrate seed crystal temperature is difficult to control. The substrate seed crystal either tends to overheat or it is difficult to achieve the lower temperatures between 600°–1250° C. at the substrate seed crystal. The overall temperature of the substrate is poorly maintained. The lack of temperature control is due to a deficiency of thermal heat conduction carrying heat away from the mount rod and the attached substrate seed crystal.

From the problems discussed above, there is definitely a need for a better way to mount the substrate seed crystal on the mount rod and to control the substrate seed crystal temperature in the 600°–1600° C. range.

SUMMARY OF THE INVENTION

It is therefore an object of the claimed invention to provide an improved means for attaching a substrate seed crystal to a mount rod and controlling the temperature at the substrate seed crystal during the formation of diamond produced by chemical vapor deposition.

It is another object of this present invention to attach a substrate seed crystal, without the use of brazing material, to a mount rod which is operable at high temperature in the 600°–1600° C. range.

These and other objects are achieved by the use of a vacuum to pull on and hold the substrate seed crystal in place and the use of a thermally conductive paint spread between the vacuum line and the substrate seed crystal which increases the thermal conductivity between the vacuum line and the substrate seed crystal. The approach of the present invention is to replace the conventional mount rod with a vacuum line and the brazing material with a vacuum. Furthermore, in a preferred embodiment, the present invention uses a lubricant between the vacuum line and the adjacent thermally conductive material to further improve thermal conductivity and temperature control at the substrate seed crystal.

BRIEF DESCRIPTION OF THE DRAWINGS

A more complete appreciation of the present invention and several of the accompanying advantages thereof will be readily obtained by reference to the following detailed description when considered in conjunction with the accompanying drawings, wherein.

DESCRIPTION OF THE PREFERRED EMBODIMENTS

The following detailed description of the invention is provided to aid those skilled in the art in practicing the present invention. However, the following detailed description of the invention should not be construed to unduly limit the present invention. Variations and modifications in the embodiments discussed may be made by those of ordinary skill in the art without departing from the scope of the present inventive discovery.

Figure 1:
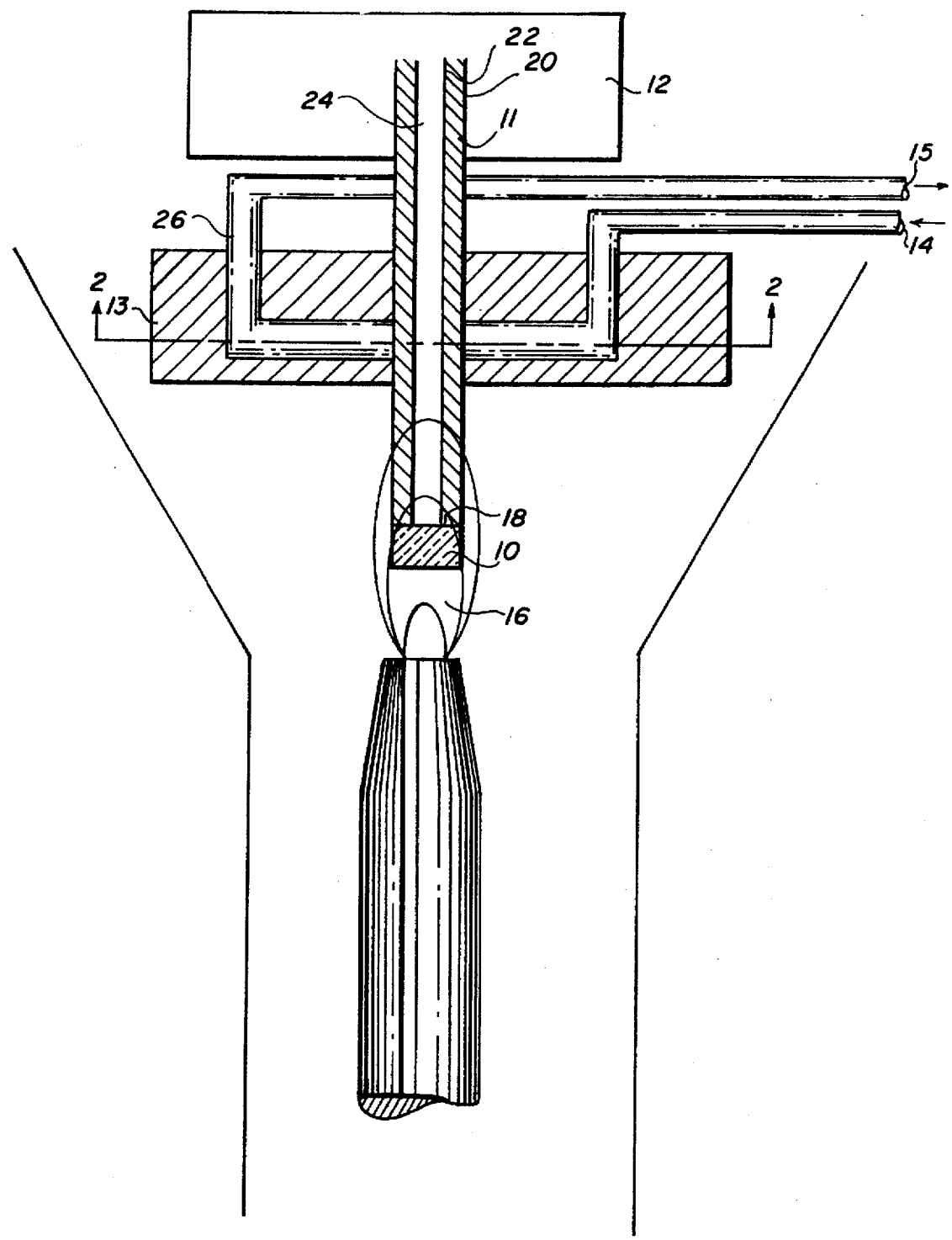
FIG. 1 is a vertical cross sectional view of an apparatus representative of a first preferred embodiment according to the present invention.

FIG. 1 shows a vertical cross-sectional view of an apparatus for the synthesis of diamond, via chemical vapor deposition, on a substrate seed crystal 10 attached onto a vacuum line 11.

To initiate a chemical vapor deposition process, the substrate seed crystal 10 is held onto the vacuum line 11 by the vacuum created by the vacuum pump 12. During chemical vapor deposition, the cross-sectional surface of vacuum line 11 nearest the oxygen-acetylene flame 16 is attached to the first surface 18 of the substrate seed crystal 10. The substrate seed crystal 10 is held onto the vacuum line 11 by the force pulling the substrate seed crystal 10 in a direction away from the flame 16 directed toward the substrate seed crystal 10. A vacuum line 11 is used instead of a mounting rod and a vacuum is pulled through the vacuum line 11 by the attached vacuum pump 12.

The extent of vacuum pulled by vacuum pump 12 should be adequate to hold the substrate seed crystal 10 in place on vacuum line 11 within flame 16 to carry out the chemical vapor deposition of diamond on the substrate seed crystal 10. For example, during chemical vapor deposition of diamond at one atmosphere, the vacuum indicated by a gauge (not shown) attached to vacuum pump 12 is typically in the broad range from 1 mm Hg to 750 mm Hg. The intermediate and preferred ranges of the vacuum pulled by vacuum pump 12 are between 1 mm Hg to 500 mm Hg and 1 mm Hg to 300 mm Hg, respectively. Such vacuums are sufficient for holding the substrate seed crystal 10 onto the vacuum line 11 during chemical vapor deposition conducted in the ambient atmosphere.

Figure 4:
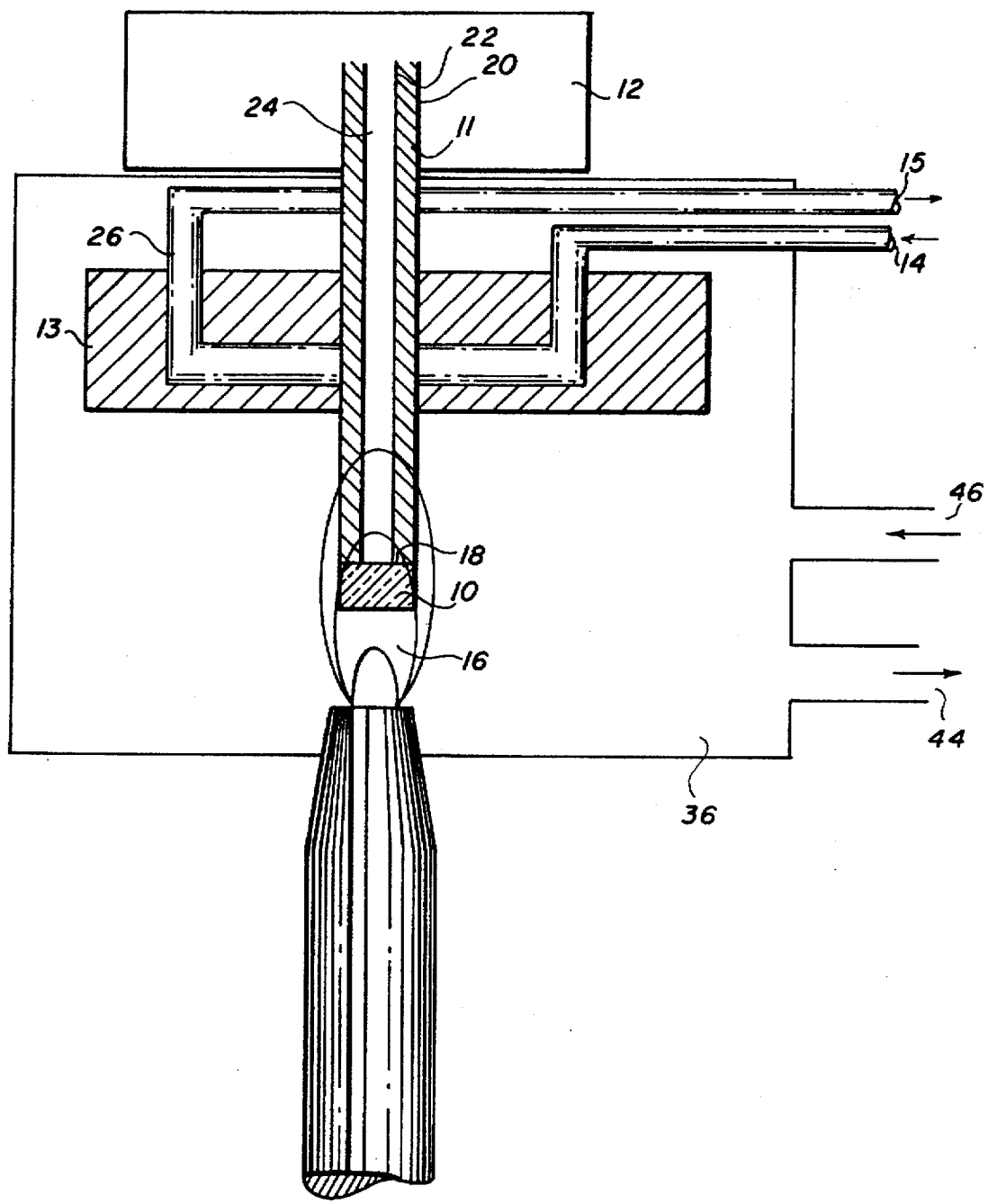
FIG. 4 is a vertical cross sectional view of an apparatus representative of a second preferred embodiment according to the present invention.

Similar pressures are used when chemical vapor deposition is conducted within chamber 36 as shown in FIG. 4 under typical conditions similar to those in the Examples below.

The vacuum line 11 is a tube made of materials selected from the group consisting of graphite, molybdenum, sapphire, diamond, alumina and beryllium oxide. The vacuum line 11 may also be made from other materials that have melting points above the temperatures at which chemical vapor deposition of diamond is carried out and such materials are otherwise stable. Generally, such materials should be stable in the 600°–1600° C. range, for example, high temperature stable ceramic materials. The materials selected from which vacuum line 11 is manufactured are those that have thermal conductivities which allow the temperature at the substrate seed crystal 10 to be obtained and controlled between 600°–1600° C. as desired. In the first preferred embodiment, the broadest range for the thermal conductivity of materials from which vacuum line 11 may be manufactured is typically between 0.2–21 W/cm-°K at 273° K. The intermediate and preferred ranges for the thermal conductivity of materials from which vacuum line 11 may be manufactured are 0.6–21 W/cm-°K and 1.0–21 W/cm-°K, respectively, at 273° K. Note that the thermal conductivity of the vacuum line 11 varies with the internal and external diameters of said vacuum line 11.

The graphite used to make vacuum line 11, in the first preferred embodiment, is known as "POCO graphite type DFP2" manufactured by Unocal Co. with part number S55POZZZ. This graphite has less than 5 ppm of impurities and it has a thermal conductivity of 1.2 W/cm-°K at room temperature of approximately 298° K.

The outer diameter 20 of the vacuum line 11 should be selected so that there is sufficient surface area at the outer diameter 20 to permit adequate heat conduction to allow the temperature of the substrate seed crystal 10 to be controlled and maintained between the 600°–1600° C. range as desired. If the outer diameter 20 is too small, there is not enough outer diameter surface area in contact with the adjacent thermally conductive material 13 to achieve the lower temperatures between 600°–1250° C. at the substrate seed crystal 10. The vacuum line 11, in the first preferred embodiment, is typically made of graphite with an outer diameter 20 ranging from 6.0 mm to 8.0 mm and an inner diameter 22 ranging from 0.5 mm to 2.0 mm. Given a substrate seed crystal 10 of a size from 2 mm to 3 mm, the outer diameter 20 should be no smaller than about 5 mm under typical conditions similar to those in the Examples below.

Outer diameters 20 of the vacuum line 11 of 5 mm and 4 mm made it very difficult to obtain temperatures below approximately 1250° C., respectively. Typically, the outer diameter 20 of vacuum line 11 below 5 mm is not recommended for obtaining temperatures below 1250° C. In the first preferred embodiment, an outer diameter 20 of the vacuum line 11 of 6.35 mm provided sufficient surface area in contact with the adjacent thermally conductive material 13 to obtain and maintain desired temperatures below 1250° C. at the substrate seed crystal 10.

The vacuum line 11, in the first preferred embodiment, extends through a thermally conductive material 13 and is in tight physical contact with it at the outer diameter 20 of the vacuum line 11. The outer diameter 20 of the vacuum line 11 is closely machined to match the internal diameter of the adjacent thermally conductive material 13 to improve the thermal conduction and temperature control at the substrate seed crystal.

In order to further improve the thermal conductivity between the vacuum line 11 and the thermally conductive material 13, the vacuum line 11 is covered with a lubricant at its outer diameter surface 20 before being inserted through the thermally conductive material 13. Typically, lubricants are those which are refractory between 150°–600° C. The preferred lubricant is a $MoS_2$ lubricant called "Molylube" and it is manufactured by Bel-Ray Co. Inc. located in Farmingdale, N.J.

In addition to using a lubricant, a thermally conductive paint is applied between the cross-sectional surface of vacuum line 11 closest to the flame 16 and the first surface 18 of the substrate seed crystal 10. The thermally conductive paint preferably has thermal conductivity and stability at high temperatures between 600°–1600° C. similar to those of the materials from which the vacuum line 11 is manufactured. In the first preferred embodiment, graphite dissolved in iso-propyl alcohol, from EMSL Supplies located in Westmont, N.J. was used on a graphite vacuum line 11 as the thermally conductive paint.

Furthermore, the length of the vacuum line exposed out of the adjacent thermally conductive material 13 and directed towards the oxygen-acetylene flame 16 is also a factor that affects the temperature at the substrate seed crystal 10. The length of the vacuum line 11 exposed out of the adjacent thermally conductive material 13 is selected to obtain temperatures between 600°–1600° C. at the substrate seed crystal 10. In the first preferred embodiment, the broadest range of the length of vacuum line 11 exposed out of the adjacent thermally conductive material 13 is typically between 0.1 mm–5 mm. The intermediate and preferred lengths of vacuum line 11 exposed needed to obtain temperatures between 600°–1600° C. at the substrate seed crystal 10 are 0.5 mm–4 mm and 1 mm–3 mm, respectively.

Figure 2:
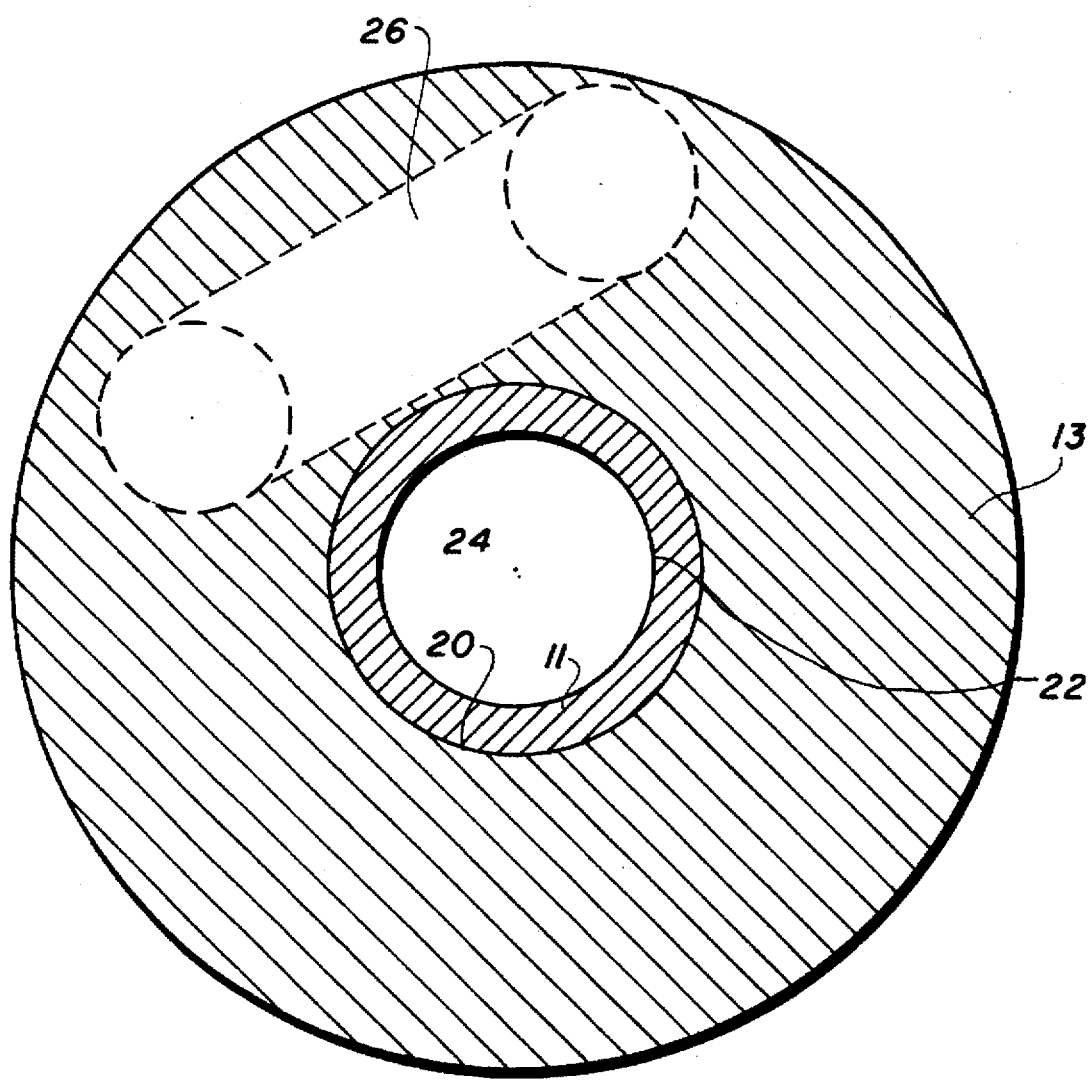
FIG. 2 is a cross sectional view of the present invention taken along line 2—2 of FIG. 1.

FIG. 2 is a cross-sectional view cutting through the thermally conductive material 13, the internal cavity 26, the vacuum line outer diameter 20, the vacuum line 11, the vacuum line internal diameter 22 and the internal cavity 24.

The thermally conductive material 13, in close contact with vacuum line 11, absorbs the heat conducted through the vacuum line 11 from the substrate seed crystal surface 18. The heat is dissipated through the lubricant from the vacuum line outer diameter surface 20 to the thermally conductive material 13. The internal cavity 26 of the thermally conductive material 13 has flowing through the cavity 26 a thermally conductive fluid entering into the cavity 26 through inlet 14 and exiting out of the cavity 26 through outlet 15. The fluid absorbs heat away from the thermally conductive material 13. The temperature of the thermally conductive material 13 can be controlled by a heat-exchanging cooling fluid such as chilled water or water at room temperature.

The thermally conductive material 13 is any material that dissipates heat at a rate which maintains the substrate at a temperature between 600° to 1600° C. during chemical vapor deposition. Typically, these thermally conductive materials have heat capacities, $C_p°$ (Joules/deg-mol), between 15–50 Joules/deg-mol at 273.15° K or thermal conductivities between 0.5–6.0 W/cm-°K at 273° K in the broadest ranges. The intermediate and preferred ranges for the thermal conductivity of thermally conductive materials suitable for the present invention are 1.0–5.0 W/cm-°K and 2.0–4.5 W/cm-°K, respectively, at 273° K. In addition, the thermally conductive material 13 is any material that is stable and unreactive with the vacuum line 11 between 150°–600° C. The preferred thermally conductive material 13 is copper with a heat capacity $C_p°$ of 24.13 Joules/deg-mol at 273.15° C. and a thermal conductivity of 4.01 W/cm-°K at 273° K.

The thermally conductive fluid is any fluid that dissipates heat at a rate which maintains the substrate temperature between 600°–1600° C. during chemical vapor deposition. Typically, the thermally conductive fluid is any fluid that does not react with the thermally conductive material 13 between about 20°–100° C. and has a heat capacity or thermal capacity, $C_p°$ (Joules/deg-mol), of between about 3–5 Joules/deg-mol at 273° K. The preferred thermally conductive fluid is water with a thermal capacity of 4.2177 Joules/gm-deg at 273.15° K.

Figure 3:
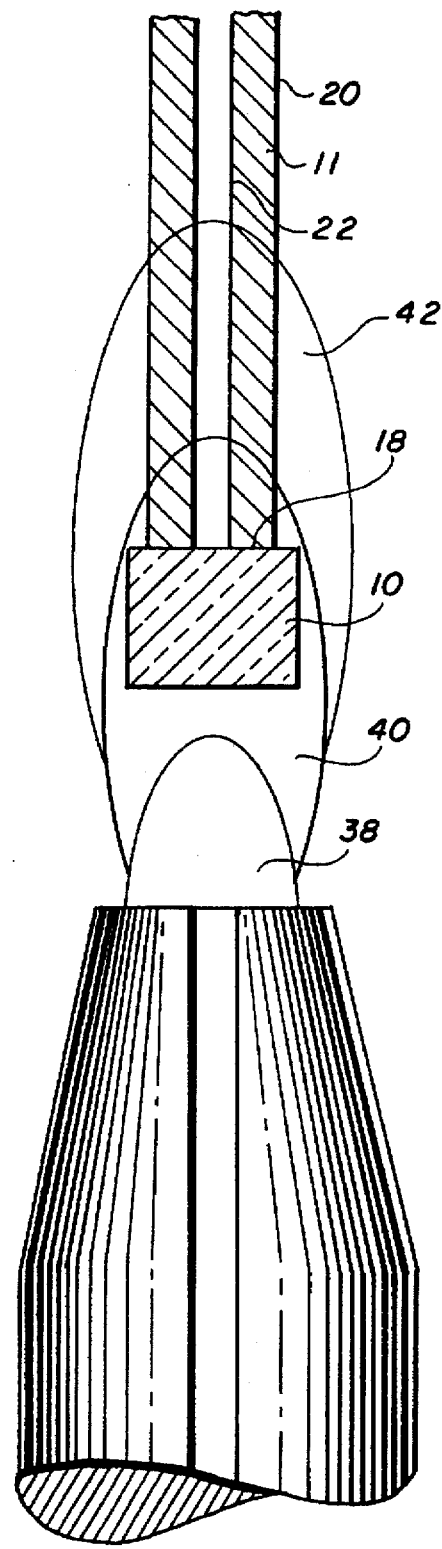
FIG. 3 is an enlarged vertical view of the flame seen in FIG. 1.

FIG. 3 is an enlargement of the flame seen in FIG. 1. Note that the source of the hydrogen and hydrocarbons is the oxygen-acetylene flame itself. As the oxygen-acetylene mixture burns to form the flame, the intermediate products of the combustion of $O_2$ and $C_2H_2$ form the sources of the hydrogen and carbon needed to promote chemical vapor deposition of diamond. Flame zone 38 (FIG. 3) is the inside cone bounded by the $O_2$–$C_2H_2$ flame front where the flame temperature is about 3000° C. Flame zone 42 (FIG. 3) is the outside flame where CO and $H_2$ produced on the inside of the flame burn to produce $CO_2$ and $H_2O$.

Flame zone 40 is the $C_2H_2$ feather where excess $C_2H_2$ burns with $O_2$ which diffuses in from the surrounding air. Flame zone 40 is seen when the $O_2/C_2H_2$ mixture ratio is fuel rich. The ratio of $O_2/C_2H_2$ that is fed into the burner to form flame 16 is a very important variable in the growth of diamond in a flame. The preferred range for the $O_2/C_2H_2$ ratio is between 0.98–1.09. If the ratio is too low more graphite is grown than diamond, and if the ratio is too high there is no net diamond growth. In the first preferred embodiment, the optimum $O_2/C_2H_2$ ratio is 1.05. In addition, the total flow rate of the oxygen (99.975%) and acetylene (99.6%), in the first preferred embodiment, was held at a constant of approximately 9 standard liters per minute.

The use of the present invention completely eliminates the need to use any kind of brazing material. Therefore, with the use of the present invention, the problem of the brazing material melting in the 900°–1200° C. temperature range is completely avoided. In addition, the possibility of the brazing material contaminating the substrate seed crystal is also eliminated. Finally, the trouble of having to remove the brazing material by chemical or other means from the substrate seed crystal 10 is also avoided. In using the present invention, all that needs to be done at the end of the chemical vapor deposition process is to turn off the vacuum pump 12 and the substrate seed crystal 10 along with any grown diamond is easily removed. Any attached graphite paint is readily removed by chromic acid. There is also no contamination of the formed diamond or the substrate seed crystal 10. Thus, the problems associated with the use of a brazing material are eliminated in their entirety. The present invention clearly achieves the object of providing an improved means for attaching a substrate seed crystal to a mount without the use of a brazing material and which mount is operable at high temperature in the 600°–1600° C. range.

Having described the invention, the following examples are given to illustrate specific applications of the invention, including the best mode now known to perform the invention. These specific examples are not intended to limit the scope of the invention described in this application.

EXAMPLES

Example 1

Chemical Vapor Deposition of Diamond Using a High Temperature Vacuum Mount in the Ambient Atmosphere.

All of the diamond films were synthesized using a premixed oxygen-acetylene welding torch with a nozzle diameter of 1.17 mm. The flow rates of the oxygen (99.975%) and acetylene (99.6%) were controlled by mass flow controllers with the total flow rate being held constant at approximately 9 standard liters per minute. The films were grown on synthetic high temperature/high pressure diamond substrates that were approximately 3 mm×3 mm×1.5 mm obtained from Sumitomo Inc. The diamond substrate was mounted in the flame using a graphite vacuum line. The specific dimensions of the graphite vacuum line used were 6.35 mm and 1.17 mm for the external diameter and the internal diameter, respectively. The vacuum line is placed in a water cooled copper block. The hole in the copper block is drilled the same size as the outer diameter of the graphite vacuum line such that the graphite vacuum line has to be forced into the copper block and therefore exhibits a very tight fit and is in good thermal contact with the copper block. A small amount of the $MoS_2$ lubricant is placed in the hole of the copper block prior to inserting the graphite vacuum line. Thereafter, the graphite paint is applied to the exposed cross-sectional surface of the vacuum line and the substrate seed crystal is placed on the graphite paint. The vacuum pump is turned on in order to hold the substrate seed crystal in place. The vacuum gauge normally indicates a vacuum between 1–300 torr.

Once the vacuum is turned on, the flame is ignited and moved in place over the substrate. The flame is centered over the substrate seed crystal with the inner cone in flame zone 38 being between 1 mm–3 mm from the exposed substrate surface. For the first 1–2 minutes, the flame is run in a neutral mode where there is no acetylene feather present, and therefore no diamond growth takes place. Once the substrate temperature reaches the desired temperature between 600°–1600° C. and the flame is properly adjusted, the $O_2/C_2H_2$ ratio is then adjusted, normally to around 1.05, to obtain an appropriate acetylene feather as seen in flame zone 40 of FIG. 3. Thereupon, diamond growth begins. The normal growth time is about 1–2 hours. The temperature at the substrate is monitored by a two-color pyrometer (not shown).

At the end of the growth process, the flame is turned off and the substrate along with any diamond film formed thereon is removed by turning off the vacuum pump.

Example 2

Chemical Vapor Deposition of Diamond Using a High Temperature Vacuum Mount in the Chamber Atmosphere.

The manner in which the growth of diamond is carried out in the chamber 36 is exactly the same as in the previous example except that a positive pressure, slightly above the ambient atmospheric pressure, of $O_2$ and Ar is used to keep the ambient air and nitrogen out of the chamber. The Ar and $O_2$ gas is introduced into the chamber 36 via inlet 46 and, if necessary, the pressure is reduced by opening outlet 44 while a positive pressure of $O_2$ and Ar is maintained in the chamber 36. The $O_2$ is also introduced into the chamber 36 through the oxygen-acetylene burner.

What is claimed is:

1. A method for the chemical vapor deposition of diamond comprising the steps of:
   (a) applying a thermally conductive paint between a substrate seed crystal, said substrate seed crystal having a surface, and an end surface of a vacuum line, the vacuum line protruding through a mount;
   (b) holding within a chemical vapor deposition flame said substrate seed crystal upon said mount by applying a vacuum to said substrate seed crystal via said vacuum line protruding through said mount, wherein a portion of an outer surface of said vacuum line in contact with said mount is coated with a thermally conductive lubricant;

(c) flowing a heat exchanging fluid through said mount to maintain said surface of said substrate seed crystal at a temperature suitable for chemical vapor deposition of diamond; and (d) directing a deposition species for chemical vapor deposition to deposit diamond onto said surface of said substrate seed crystal.

2. The method of claim 1 wherein said thermally conductive paint comprises graphite dissolved in isopropyl alcohol.

3. The method of claim 1 wherein said thermally conductive lubricant comprises molybdenum disulfide.

4. The method of claim 1 wherein said temperature is between 600°–1600° C.

5. The method of claim 1 wherein said temperature is between 900°–1200° C.

* * * * *